United States Patent [19]
Groe

[11] Patent Number: 5,990,740
[45] Date of Patent: Nov. 23, 1999

[54] DIFFERENTIAL AMPLIFIER WITH ADJUSTABLE LINEARITY

[75] Inventor: John B. Groe, Poway, Calif.

[73] Assignee: Nokia Mobile Phones, Espoo, Finland

[21] Appl. No.: 08/982,752

[22] Filed: Dec. 2, 1997

[51] Int. Cl.[6] .................................................. H03F 3/45
[52] U.S. Cl. .......................................... 330/252; 330/254
[58] Field of Search ..................................... 330/252, 254, 330/149; 327/359

[56] References Cited

U.S. PATENT DOCUMENTS

| | | | |
|---|---|---|---|
| 4,514,702 | 4/1985 | Zogg | 330/254 |
| 4,779,057 | 10/1988 | Woo . | |
| 5,006,818 | 4/1991 | Koyama et al. | 330/261 |
| 5,289,136 | 2/1994 | Deveirman et al. | 330/252 |
| 5,329,173 | 7/1994 | Murakami et al. | 307/355 |
| 5,331,290 | 7/1994 | Harford et al. . | |
| 5,467,057 | 11/1995 | Joardar | 330/254 |
| 5,469,106 | 11/1995 | Dow | 330/254 |
| 5,477,191 | 12/1995 | DeMicheli | 330/254 |
| 5,508,645 | 4/1996 | Castellucci et al. | 327/77 |
| 5,515,004 | 5/1996 | Alford et al. | 330/254 |
| 5,528,197 | 6/1996 | Frey | 330/254 |
| 5,530,444 | 6/1996 | Tice et al. | 330/252 |
| 5,572,166 | 11/1996 | Gilbert | 330/254 |
| 5,677,646 | 10/1997 | Entrikin | 330/149 |
| 5,818,279 | 10/1998 | Dick | 327/350 |

FOREIGN PATENT DOCUMENTS 0 589 676 A1   3/1994   European Pat. Off. .

OTHER PUBLICATIONS

Akio Yamamoto, et al., "Wide Bank and Los Supply Voltage ICs for Satellite Tuner Unit", *IEEE Transactions on Consumer Electronics*, Aug. 1992, pp. 402–408, vol.38, No. 3.

Muhammad I. Ali, et al., "A BiCMOS Low Distortion Tunable OTA for Continuous–Time Filters", IEEE Transactions on Circuits and Systems I:Fundamental Theory and Applications, Jan. 1993, pp. 43–49, vol. 40, No. 1.

*Primary Examiner*—Robert Pascal
*Assistant Examiner*—Khanh Van Nguyen
*Attorney, Agent, or Firm*—Brown, Martin, Haller & McClain

[57] ABSTRACT

A differential amplifier with adjustable linearity is disclosed herein. The differential amplifier includes a differential pair amplifier and a linearization circuit. The differential pair amplifier receives a differential input voltage and amplifies the differential input voltage to produce an amplified output voltage. The linearization circuit receives the amplified output voltage and generates a compensation signal in response thereto. The compensation signal, which has a magnitude adjustable in response to a linearity adjustment signal, is applied to the differential pair amplifier. The differential pair amplifier uses the compensation signal to apply compensation to the amplification of the differential input voltage. Thus, the linearity of the differential amplifier is adjustable by modifying the linearity adjustment signal. The differential pair amplifier includes a bipolar differential transistor pair having their emitters coupled together to form a common emitter node. A first adjustable current source coupled to the common emitter node provides a gain adjustment signal for adjusting the gain of the differential pair amplifier. The linearization circuit includes a diode element pair having their cathodes coupled together to form a common cathode node. A second adjustable current source coupled to the common cathode node provides the linearity adjustment signal for adjusting the linearity of the differential pair. In another embodiment, the differential pair amplifier includes a differential common-base amplifier.

22 Claims, 3 Drawing Sheets

DIFFERENTIAL AMPLIFIER WITH ADJUSTABLE LINEARITY

FIELD OF THE INVENTION

The present invention generally relates to the field of differential amplifiers, and specifically relates to a differential amplifier having adjustable linearity.

BACKGROUND OF THE INVENTION

Differential amplifiers are used to amplify the difference voltage between two input signals. A common mode input change occurs when the two input signals change together, and a normal mode input change occurs when the difference voltage between the two input signals changes. Ideally, the output voltage of a differential amplifier responds only to normal mode input changes and is independent of common mode input changes. The response of a differential amplifier can be measured by determining the ratio of the response for a normal mode signal to the response for a common mode signal. This quantity is the common-mode rejection ratio (CMRR), with good differential amplifiers having high CMRRs.

The normal mode voltage gain of a differential amplifier is the ratio of the amplified output voltage to the differential input voltage. Ideally, the gain of a differential amplifier does not depend on the magnitude of the differential input voltage. However, gain of a differential amplifier typically has a maximum value when the differential input voltage is small, and then decreased values as the magnitude of the differential input voltage increases. The change in gain causes distortion in the amplified output voltage. The degree to which the gain changes based on the differential input voltage can be specified as the linearity of the differential amplifier. Amplifier linearity, for example, can be defined as the largest differential input voltage within an acceptable gain limit of −1 dB, with good differential amplifiers having high linearity and, hence, low distortion and high dynamic range.

A conventional differential amplifier circuit 10 is shown in FIG. 1. Circuit 10 includes a first transistor 12 and a second transistor 14 arranged as a pair. Transistors 12 and 14 each have a base, a collector, and an emitter. The emitters of transistors 12 and 14 are connected together at a common emitter node 16. The collectors of transistors 12 and 14 are each connected to a first supply voltage $+V_{CC}$ through first and second load elements 18 and 20, respectively. Load elements 18 and 20 may include, for example, resistors $R_L$ or impedances $Z_L$. A differential input voltage $V_{IN}$ is connected across the bases of transistors 12 and 14, with the positive $V_{IN}$ node connected to the base of transistor 12 and the negative $V_{IN}$ node connected to the base of transistor 14. Common emitter node 16 is connected to a second supply voltage $-V_{EE}$ through an adjustable current source 22. The amplified output voltage $V_{OUT}$ of circuit 10 is taken across the collectors of transistors 12 and 14, with the positive $V_{OUT}$ node at the collector of transistor 14 and the negative $V_{OUT}$ node at the collector of transistor 12. Transistors 12 and 14 are, for example, bipolar npn transistors formed within a common integrated circuit.

The voltages around the loop including differential input voltage $V_{IN}$ and the base-emitter junctions of transistors 12 and 14 yields:

$$V_{IN} - V_{BE1} + V_{BE2} = 0 \quad (1)$$

Provided that $V_{BE1}$ and $V_{BE2}$ are much greater than the thermal voltage $V_T$ (25.3 mV at room temperature of 68° F. or 20° C.), the Ebers-Moll transistor model yields:

$$V_{BE1} = V_T \ln(I_1/I_{S1}) \quad (2)$$

$$V_{BE2} = V_T \ln(I_2/I_{S2}) \quad (3)$$

wherein the thermal voltage $V_T = kT/q$, k is Boltzmann's constant ($1.38 \times 10^{-23}$ joules/° K), T is the absolute temperature in degrees Kelvin, q is the electron charge ($1.60 \times 10^{-19}$ coulombs), and $I_{S1}$ and $I_{S2}$ are the saturation currents of transistors 12 and 14, respectively. Combining equations (1) through (3) and solving for $I_1/I_2$ gives the ratio of the collector currents:

$$I_1/I_2 = \exp(V_{IN}/V_T) \quad (4)$$

wherein saturation currents $I_{S1}$ and $I_{S2}$ of transistors 12 and 14 are assumed to be equal (i.e., transistors 12 and 14 are matched). Now, assuming that the current gain $h_{FE}$ of transistors 12 and 14 is high so the base currents can be ignored, summing the current into common emitter node 16 yields:

$$I_E = I_1 + I_2 \quad (5)$$

wherein $I_E$ is the tail current through current source 22. Combining equations (4) and (5), the collector currents can be written as:

$$I_1 = I_E/(1 + \exp(-V_{IN}/V_T)) \quad (6)$$

$$I_2 = I_E/(1 + \exp(V_{IN}/V_T)) \quad (7)$$

Referring to FIG. 2, collector currents $I_1$ and $I_2$ are plotted as a function of differential input voltage $V_{IN}$. The graph shows that at $V_{IN} = 0$, tail current $I_E$ is split equally between transistors 12 and 14. At high positive $V_{IN}$, tail current $I_E$ passes substantially through transistor 12 (i.e., $I_1 = I_E$ and $I_2 \approx 0$). At high negative $V_{IN}$, tail current $I_E$ passes substantially through transistor 14 (i.e., $I_2 \approx I_E$ and $I_1 \approx 0$).

The voltage gain $A_V$ of differential amplifier circuit 10 is defined as:

$$A_V = V_{OUT}/V_{IN} \quad (8)$$

wherein $$V_{OUT} = R_L(I_1 - I_2) = R_L \Delta I \quad (9)$$

The small signal gain of differential amplifier circuit 10 is:

$$A_V = g_m R_L \quad (10)$$

wherein the transconductance, $g_m$, is:

$$g_m = (\partial I_c / \partial V_{be}) = \frac{1}{2} I_E / V_T \quad (11)$$

Thus, $g_m$ depends on the adjustment of adjustable current source 22.

Referring to FIG. 3, the small signal gain $A_V = g_m R_L$ is the maximum voltage gain which occurs at small magnitudes of differential input voltage $V_{IN}$ (e.g., at $V_{IN} = 0$, $A_V = g_m R_L$). However, as shown, voltage gain $A_V$ decreases as the magnitude of $V_{IN}$ increases. The amplifier linearity can be defined as the largest magnitude of $V_{IN}$ wherein voltage gain $A_V$ is within acceptable gain limits. For example, if the acceptable gain limit is −1 dB, amplifier linearity is within the range of $V_{IN-}$ to $V_{IN+}$. However, the linearity of the circuit of FIG. 1 is relatively low, and it would be desirable to provide a differential amplifier circuit having expanded linearity.

BRIEF SUMMARY OF THE INVENTION

It is an advantage of the present invention to provide a differential amplifier having adjustable linearity.

It is another advantage of the present invention to provide a differential amplifier for amplifying a differential input voltage wherein linearity is simply and easily adjusted.

It is still another advantage of the present invention to provide a differential amplifier including a differential pair amplifier for amplifying a differential input voltage and a linearization circuit for applying compensation to the differential pair amplifier for increased linearity.

Yet another advantage of the present invention is to provide a differential amplifier having adjustable linearity and adjustable gain.

Still another advantage of the present invention is to provide a differential amplifier including a differential pair amplifier for amplifying a differential input voltage with an easily adjustable gain, and a linearization circuit for applying adjustable compensation to the differential pair amplifier such that the differential amplifier has adjustable linearity.

It is yet another advantage of the present invention to provide a simple differential amplifier having adjustable linearity and adjustable gain which comprises a minimum number of similar circuit components for efficient formation on an integrated circuit.

In one embodiment of the present invention, a differential amplifier having adjustable linearity includes a differential pair amplifier for receiving a differential input voltage and amplifying the differential input voltage to produce an amplified output voltage, and a linearization circuit for receiving the amplified output voltage from the differential pair amplifier and for generating a compensation signal in response thereto which is applied to the differential pair amplifier, the compensation signal having a magnitude adjustable in response to a linearity adjustment signal. The differential pair amplifier applies compensation to the amplification of the differential input voltage based upon the compensation signal such that the linearity of the differential amplifier depends upon the linearity adjustment signal.

In another embodiment of the present invention, a differential amplifier having adjustable linearity includes differential amplifier means for receiving a differential input voltage and for amplifying the differential input voltage to produce an amplified output voltage, linearization means for receiving the amplified output voltage and for generating a compensation signal in response thereto, means for adjusting the compensation signal in response to a linearity adjustment signal, and means for applying compensation to the amplification of the differential input voltage based upon the compensation signal such that the linearity of the differential amplifier depends upon the linearity adjustment signal.

In yet another embodiment of the present invention, a differential amplifier for amplifying a differential input voltage to generate an amplified output voltage includes first and second transistors arranged as a pair. The emitters of the transistor pair are coupled together at a common emitter node, and the collectors of the transistor pair are coupled to a first supply voltage through first and second load elements, respectively. The differential input voltage is coupled across the bases of the transistor pair. The common emitter node is coupled to a second supply voltage through a first current source, and the amplified output voltage is taken across the collectors of the transistor pair. The differential amplifier also includes first and second diode elements arranged as a pair. The cathodes of the diode element pair are coupled together at a common cathode node, and the anodes of the diode element pair are coupled to the collectors of the transistor pair. The common cathode node is coupled to the second supply voltage through a second current source. Thus, the diode element pair forms a linearization circuit to increase the linearity of the differential amplifier.

In another embodiment of the present invention, a differential amplifier for amplifying a differential input voltage to generate an amplified output voltage includes first and second transistors arranged as a pair. Each of the transistors has a base, a collector and an emitter. The bases of the transistors are coupled to a common bias signal. The collectors are coupled to a first supply voltage through first and second load elements, respectively. The differential input voltage is coupled across the emitters of the transistors and the amplified output voltage is taken across the collectors of the transistors. The differential amplifier also includes first and second diode elements arranged as a pair. Each of the diode elements has an anode and a cathode. The cathodes are coupled together at a common cathode node, and the anodes are coupled to the collectors of the transistors. The common cathode node is coupled to a second supply voltage through a current source. The first and second diode elements form a linearization circuit to increase the linearity of the differential amplifier.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which.

DETAILED DESCRIPTION OF A PREFERRED EMBODIMENT

Figure 4:
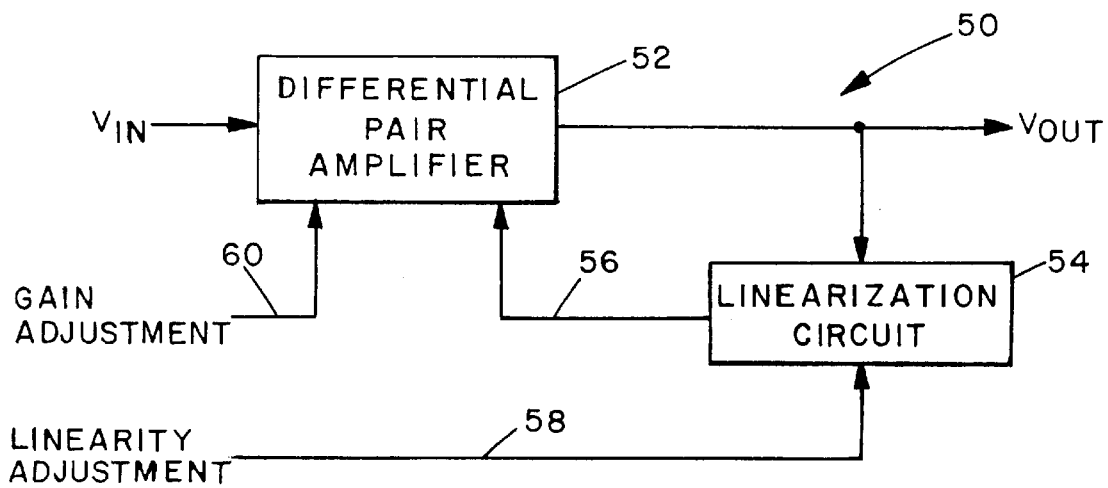
FIG. 4 is a block diagram of a differential amplifier circuit having adjustable gain and linearity in accordance with the present invention.

Referring to FIG. 4, an improved differential amplifier circuit 50 is shown. Circuit 50 includes a differential pair amplifier 52 coupled to a linearization circuit 54. Differential pair amplifier 52 is configured to receive a differential input voltage $V_{IN}$ and to amplify $V_{IN}$ to produce an amplified output voltage $V_{OUT}$. Linearization circuit 54 is configured to receive $V_{OUT}$ and to generate a compensation signal 56 in response thereto. Compensation signal 56 is applied to differential pair amplifier 52. The magnitude of compensation signal 56 is adjustable in response to a linearity adjustment signal 58. Differential pair amplifier 52 combines its own natural gain response with compensation signal 56 to produce output voltage $V_{OUT}$, thereby linearizing the amplification of $V_{IN}$. The degree of linearization depends on the value of compensation signal 56, which can be adjusted using linearity adjustment signal 58. The linearity of circuit 50 as compared to circuit 10 is increased to a degree which depends on the adjustment of linearization circuit 54. The gain of differential pair amplifier 52 depends on a gain adjustment signal 60. Thus, both the gain and linearity of circuit 50 are adjustable.

Figure 5:
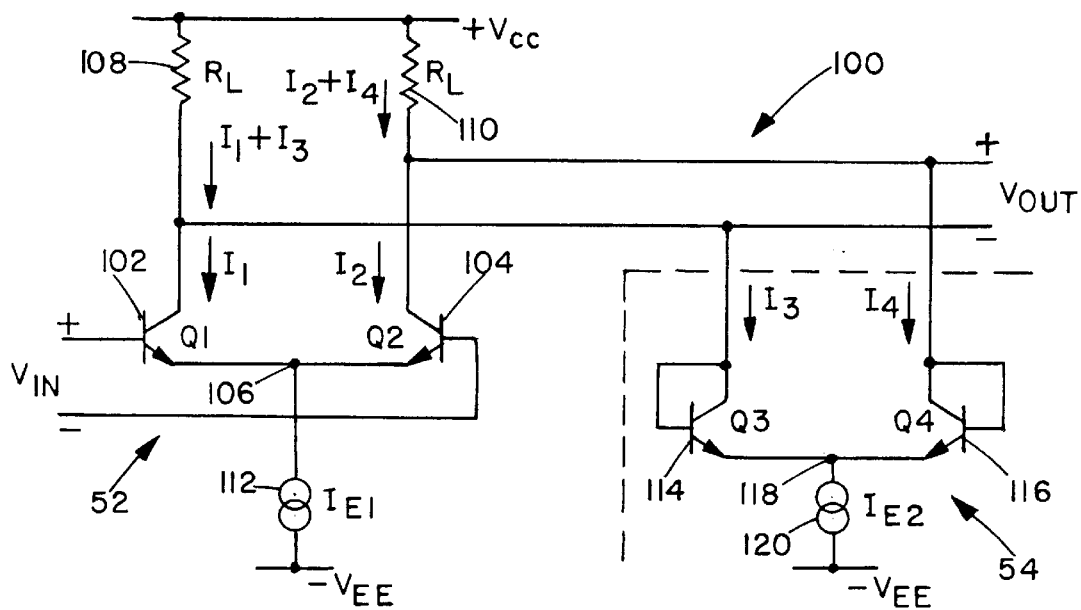
FIG. 5 is a schematic diagram of a preferred embodiment of a differential amplifier circuit in accordance with the present invention.

A preferred embodiment of circuit 50 is shown in FIG. 5 as differential amplifier circuit 100. Differential pair amplifier 52 includes a first transistor 102 and a second transistor 104 arranged as a pair. Transistors 102 and 104 each have a base, a collector, and an emitter. The emitters of transistors 102 and 104 are connected together at a common emitter node 106. The collectors of transistors 102 and 104 are each connected to a first supply voltage $+V_{CC}$ through first and second load elements 108 and 110, respectively. Load elements 108 and 110 may include, for example, resistors $R_L$ or impedances $Z_L$. A differential input voltage $V_{IN}$ is connected across the bases of transistors 102 and 104, with the positive $V_{IN}$ node connected to the base of transistor 102 and the negative $V_{IN}$ node connected to the base of transistor 104. Common emitter node 106 is connected to a second supply voltage $-V_{EE}$ through a first adjustable current source 112. The amplified output voltage $V_{OUT}$ of circuit 100 is taken across the collectors of transistors 102 and 104, with the positive $V_{OUT}$ node at the collector of transistor 104 and the negative $V_{OUT}$ node at the collector of transistor 102. Transistors 102 and 104 can be bipolar npn transistors formed in a common integrated circuit. However, other transistors such as pnp transistors can also be used.

Linearization circuit 54 of circuit 100 includes a first diode element 114 and a second diode element 116 arranged as a pair. Diode elements 114 and 116 are preferably diode-connected transistors formed by connecting the base and collector terminals of respective transistors of the same type as transistors 102 and 104 together. Thus, transistors 102 and 104 and diode elements 114 and 116 can be efficiently formed in a single integrated circuit. Diode elements 114 and 116 each have an anode and a cathode. The cathodes of elements 114 and 116 are connected together at a common cathode node 118. The anodes of elements 114 and 116 are connected to the collectors of transistors 102 and 104, respectively. Thus, the anodes of elements 114 and 116 are also connected to the negative and positive nodes, respectively, of output voltage $V_{OUT}$. Common cathode node 118 is connected to second supply voltage $-V_{EE}$ through a second adjustable current source 120. As shown below, circuit 54 provides linearization to differential pair amplifier 52 to increase the linearity of circuit 100.

The analysis of differential pair amplifier 52 is similar to the analysis of circuit 10 above, and like parts of the analysis are not repeated herein. In particular, equations (1) through (8) above still apply, with $I_E$ replaced with $I_{E1}$, to determine the collector currents through transistors 102 and 104:

$$I_1 = I_{E1}/(1 + exp(-V_{IN}/V_T)) \quad (12)$$

$$I_2 = I_{E1}/(1 + exp(V_{IN}/V_T)) \quad (13)$$

Figure 1:
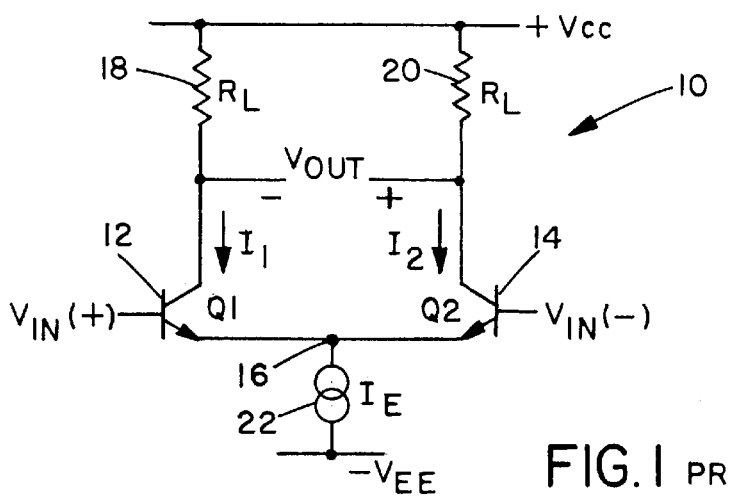
FIG. 1 is a schematic diagram of a conventional differential amplifier circuit.
Figure 2:
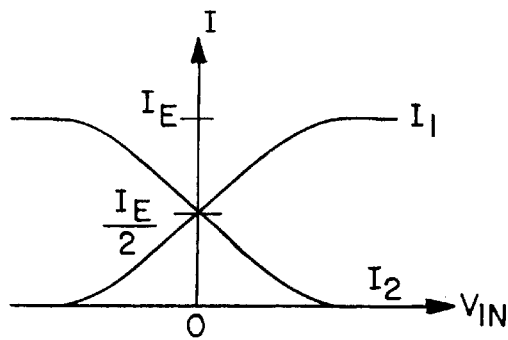
FIG. 2 is a graph illustrating the collector currents in the differential amplifier circuit of FIG. 1 as a function of the differential input voltage.

The graph of $I_1$ and $I_2$ is as shown in FIG. 2, with $I_E$ replaced by $I_{E1}$. However, the amplification of differential input voltage $V_{IN}$ by the entirety of differential amplifier circuit 100 is now affected by compensation introduced by linearization circuit 54, as set forth below.

The voltages around the loop including output voltage $V_{OUT}$ and the base-emitter junctions of diode elements 114 and 116 yields:

$$V_{OUT} - V_{BE4} + V_{BE3} = 0 \quad (14)$$

Provided that $V_{BE3}$ and $V_{BE4}$ are much greater than the thermal voltage $V_T$ (25.3 mV at room temperature of 68° F. or 20° C.), the Ebers-Moll transistor model yields:

$$V_{BE3} = V_T ln(I_3/I_{S3}) \quad (15)$$

$$V_{BE4} = V_T ln(I_4/I_{S4}) \quad (16)$$

wherein $I_{S3}$ and $I_{S4}$ are the saturation currents of diode elements 114 and 116, respectively. Combining equations (14) through (16) and solving for $I_4/I_3$ gives the ratio of the diode element currents:

$$I_4/I_3 = exp(V_{OUT}/V_T) \quad (17)$$

wherein saturation currents $I_{S3}$ and $I_{S4}$ of diode elements 114 and 116 are assumed to be equal (i.e., elements 114 and 116 are matched). Now, summing the current into common cathode node 118 yields:

$$I_{E2} = I_3 + I_4 \quad (18)$$

wherein $I_{E2}$ is the tail current through adjustable current source 120. Combining equations (17) and (18), currents $I_3$ and $I_4$ can be written as:

$$I_3 = I_{E2}/(1 + exp(V_{OUT}/V_T)) \quad (19)$$

$$I_4 = I_{E2}/(1 + exp(-V_{OUT}/V_T)) \quad (20)$$

Figure 6:
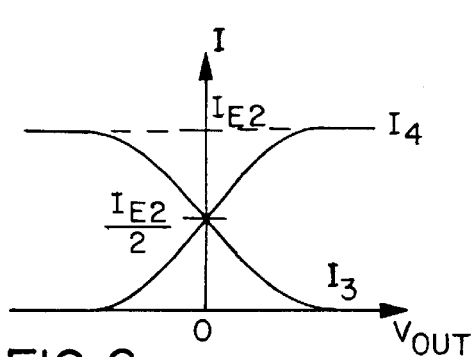
FIG. 6 is a graph illustrating the diode element currents in the differential amplifier circuit of FIG. 5 as a function of the amplified output voltage.

Referring to FIG. 6, currents $I_3$ and $I_4$ are plotted as a function of output voltage $V_{OUT}$. The graph shows that at $V_{OUT} = 0$, tail current $I_{E2}$ is split equally between elements 114 and 116. At high positive $V_{OUT}$, tail current $I_{E2}$ passes substantially through element 116 (i.e., $I_3 \approx 0$ and $I_4 \approx I_{E2}$). At high negative $V_{OUT}$, tail current $I_{E2}$ passes substantially through element 114 (i.e., $I_3 \approx I_{E2}$ and $I_4 \approx 0$). Thus, with the cathodes of elements 114 and 116 coupled together like the emitters of a differential pair, currents $I_3$ and $I_4$ behave in a similar fashion to the collector currents in the differential pair.

The current flowing through load element 108 is the sum of $I_1$ and $I_3$, and the current flowing through load element 110 is the sum of $I_2$ and $I_4$. As shown in FIGS. 2 and 6, currents $I_1$ and $I_3$ are complements of each other (i.e., $I_3$ decreases as $I_1$ increases, and vice versa), as are currents $I_2$ and $I_4$ (i.e., $I_4$ increases as $I_2$ decreases, and vice versa). Examining the effects of a change in differential input voltage $V_{IN}$ shows that the complementary nature of $I_3$ and $I_4$ introduces compensation into circuit 100. An increase in $V_{IN}$ causes $I_1$ to increase and $I_2$ to decrease. The resulting increase in $V_{OUT}$ due to voltage gain $A_V$ causes $I_3$ to decrease and $I_4$ to increase. Since the voltage at the negative $V_{OUT}$ node depends on the sum of $I_1$ and $I_3$, the effect of $I_3$ is to reduce the effect of $I_1$ (i.e., $I_3$ introduces compensation). Similarly, since the voltage at the positive $V_{OUT}$ node depends on the sum of $I_2$ and $I_4$, the effect of $I_4$ is to reduce the effect of $I_2$ (i.e., $I_4$ introduces compensation). A decrease in $V_{IN}$ has the opposite effects. Thus, $I_3$ and $I_4$ are compensation signals which reduce the effects of $V_{IN}$, and the level of compensation is controlled by the adjustment of current source 120.

The voltages around the loop including output voltage $V_{OUT}$ and load elements 108 and 110 yields:

$$V_{OUT}=R_L(\Delta I_{IN}-\Delta I_{FB}) \qquad (21)$$

wherein $\Delta I_{IN}$ is defined as $(I_1-I_2)$ and $\Delta I_{FB}$ is defined as $(I_4-I_3)$. The current $\Delta I_{IN}$ is approximated by the hyberbolic tangent function:

$$\Delta I_{IN}=I_{E1}\tanh(V_{IN}/V_T) \qquad (22)$$

and the current $\Delta I_{FB}$ is approximated by the hyberbolic tangent function:

$$\Delta I_{FB}=I_{E2}\tanh(V_{OUT}/V_T) \qquad (23)$$

Combining equations (21) through (23) yields output voltage $V_{OUT}$:

$$V_{OUT}=R_L[I_{E1}\tanh(V_{IN}/V_T)-I_{E2}\tanh(V_{OUT}/V_T)] \qquad (24)$$

which is a transcendental expression.

The effect of linearization circuit 54 on voltage gain $A_V$ and linearity of circuit 100 can be described using a graphical technique. The voltage gain $A_V$ of a simple differential pair amplifier was shown in FIG. 3. Linearization circuit 54 introduces a linearization factor f which is plotted in FIG. 7 and is described by the equation:

$$f|I_4-I_3| R_L\Delta I_{FB} \qquad (25)$$

Figure 3:
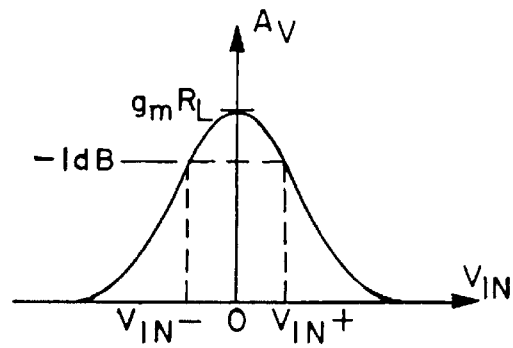
FIG. 3 is a graph illustrating the gain and linearity of the differential amplifier circuit of FIG. 1 as a function of the differential input voltage.
Figure 7:
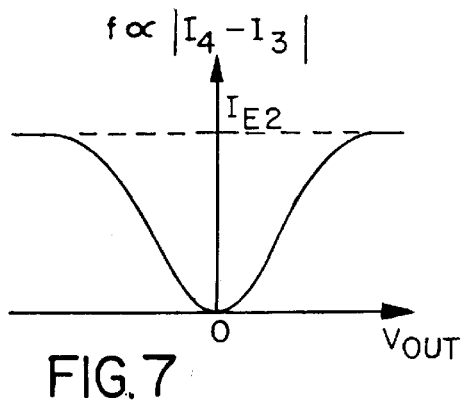
FIG. 7 is a graph illustrating the magnitude of the linearization factor in the differential amplifier circuit of FIG. 5 as a function of the amplified output voltage.
Figure 8:
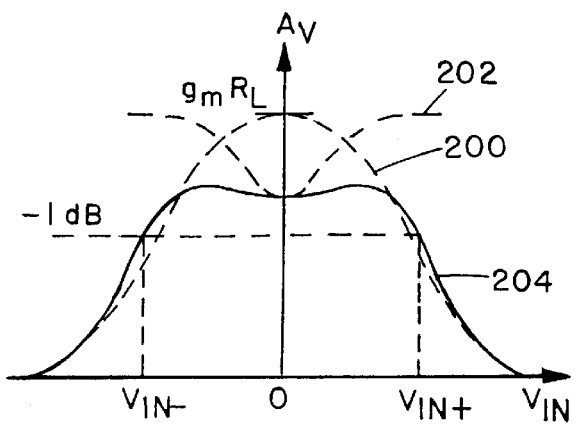
FIG. 8 is a graph illustrating the overall gain and linearity of the differential amplifier circuit of FIG. 5 as a function of the differential input voltage.

After scaling the x-axis of FIG. 7 to match that of FIG. 3, the responses of differential pair amplifier 52 and linearization circuit 54 are combined to reveal the overall response of differential amplifier circuit 100 in FIG. 8. Dashed line 200 shows the response of a simple differential pair amplifier, dashed line 202 shows the linearization factor, and solid line 204 shows the overall response. The graph shows that linearity (e.g., the input voltage range $V_{IN-}$ to $V_{IN+}$ having an acceptable gain limit of -1 dB) of circuit 100 is expanded relative to the linearity of simple differential amplifier circuit 10.

Figure 9:
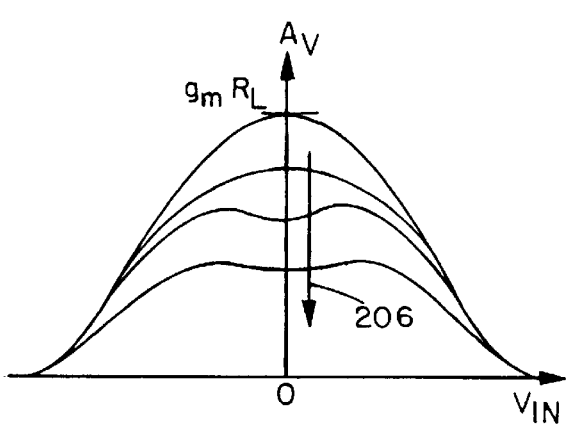
FIG. 9 is a graph illustrating the overall gain and linearity of the differential amplifier current of FIG. 5 as a function of the differential input voltage as the current source in the linearization circuit is adjusted.

Referring to FIG. 9, voltage gain $A_V$ of circuit 100 is shown for a number of tail currents $I_{E2}$, which increases in the direction of arrow 206. $I_{E2}$ depends upon the adjustment of adjustable current source 120. The graph shows that adjustable current source 120 can be used to adjust the linearity of differential amplifier circuit 100. Thus, voltage gain $A_V$ and linearity of differential amplifier circuit 100 can be varied by changing the settings of adjustable current sources 112 and 120.

Thus, differential amplifier circuit 100 uses a simple linearization circuit 54 to provide increased linearity as compared to a conventional differential amplifier circuit. Linearity is easily adjusted by changing the setting of adjustable current source 120. Linearization circuit 54 affects the voltage output of differential amplifier circuit 100 such that its effect on noise figure is minimal. In addition, linearization circuit 54 does not require an increase in the supply voltage $V_{CC}-V_{EE}$. Further, the elements of linearization circuit 54 are formed using the same type of elements as differential pair amplifier circuit 52 to allow efficient production within an integrated circuit.

Figure 10:
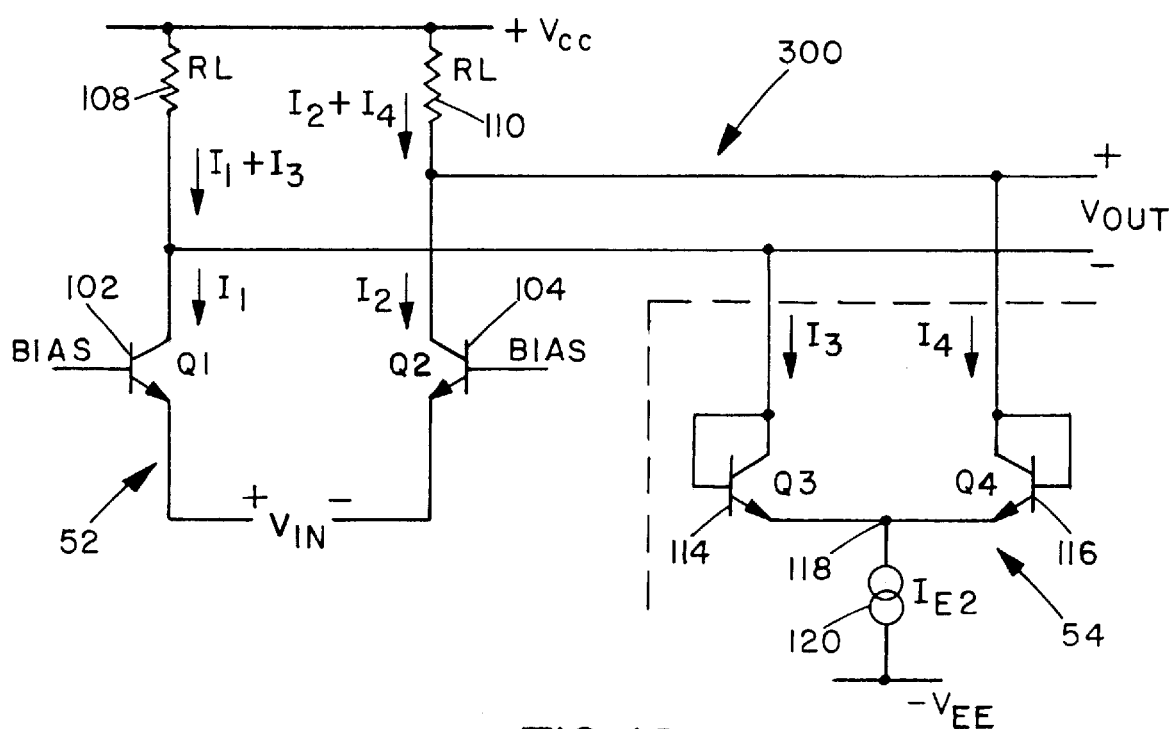
FIG. 10 is a schematic diagram of another embodiment of a differential amplifier circuit in accordance with the present invention.

Referring to FIG. 10, a differential amplifier circuit 300 shows another embodiment of the present invention. Circuit 300 is similar to circuit 100 shown in FIG. 5, except that differential input voltage $V_{IN}$ is connected across the emitters of transistors 102 and 104 instead of across the bases as in FIG. 5, and a common bias signal BIAS is connected to the bases of transistors 102 and 104 to bias the current flowing through the transistors. The positive $V_{IN}$ node is connected to the emitter of transistor 102 and the negative $V_{IN}$ node is connected to the emitter of transistor 104. Amplifier 52 in circuit 300 is thus configured as a differential common-base amplifier.

When $V_{IN}=0$, common bias signal BIAS causes equal current to flow through transistors 102 and 104 (i.e., $I_1=I_2$), similar to the equal current levels in an emitter-coupled differential pair. Without compensation, currents $I_1$ and $I_2$ change in response to changes in $V_{IN}$ such that voltage gain $A_V$ as a function of $V_{IN}$ appears similar to the graph shown in FIG. 3. Gain $A_V$ is adjusted by changing the level of common bias signal BIAS. The effect of linearization circuit 54 is to introduce compensation as described above, with current source 120 being used to adjust the linearity of circuit 300.

It will be evident that there are additional embodiments and applications which are not disclosed in the detailed description but which clearly fall within the scope and spirit of the present invention. The specification is, therefore, not intended to be limiting, and the scope of the invention is to be limited only by the following claims.

I claim:

1. A differential amplifier having adjustable linearity, comprising:
   a differential pair amplifier configured to receive a differential input voltage, and to amplify the differential input voltage to produce an amplified output voltage across a differential output terminal; and
   a linearization circuit operatively coupled to the differential pair amplifier at the differential output terminal, the linearization circuit producing a compensation signal that interacts with the amplified output voltage to adjust the linearity of the differential amplifier; and
   a linearity adjustment signal for providing control of the compensation signal;
   wherein the linearity of the differential amplifier depends upon the linearity adjustment signal.

2. The differential amplifier of claim 1, wherein the differential pair amplifier amplifies the differential input voltage with an adjustable gain set in response to a gain adjustment signal.

3. The differential amplifier of claim 2, wherein the differential pair amplifier includes a bipolar differential pair, the bipolar differential pair including first and second transistors having first and second emitters, respectively, the first and second emitters being coupled to each other at a common emitter node.

4. The differential amplifier of claim 3, further comprising an adjustable current source coupled to the common emitter node, wherein the gain adjustment signal depends on the adjustment of the adjustable current source.

5. The differential amplifier of claim 2, wherein the differential pair amplifier includes a bipolar differential pair, the bipolar differential pair including first and second transistors having first and second bases, respectively, the first and second bases being coupled to a common bias signal.

6. The differential amplifier of claim 1, wherein the linearization circuit includes a diode element pair, the diode element pair including first and second diode elements having first and second cathodes, respectively, the first and second cathodes being coupled to each other at a common cathode node.

7. The differential amplifier of claim 6, further comprising an adjustable current source coupled to the common cathode node, wherein the linearity adjustment signal depends on the adjustment of the adjustable current source.

8. The differential amplifier of claim 2, wherein the differential pair amplifier includes a bipolar differential pair, the bipolar differential pair including first and second transistors having first and second emitters, respectively, the first and second emitters being coupled to each other at a common emitter node, and the linearization circuit includes a diode element pair, the diode element pair including first and second diode elements having first and second cathodes, respectively, the first and second cathodes being coupled to each other at a common cathode node, further comprising first and second adjustable current sources, the first adjustable current source being coupled to the common emitter node such that the gain adjustment signal depends on the adjustment of the first adjustable current source, and the second adjustable current source being coupled to the common cathode node such that the linearity adjustment signal depends on the adjustment of the second adjustable current source.

9. The differential amplifier of claim 1, wherein the differential pair amplifier and the linearization circuit are formed on an integrated circuit.

10. A differential amplifier having adjustable linearity, the differential amplifier having a differential voltage input and a differential voltage output, comprising:

differential amplifier means for receiving an input signal at the differential voltage input, and for amplifying the input signal to produce an amplified output signal at the differential voltage output;

linearization means coupled to the differential voltage output, the linearization means for generating a compensation signal; and means for adjusting the compensation signal in response to a linearity adjustment signal;

wherein the linearity of the differential amplifier is based upon the compensation signal which is controllable by the linearity adjustment signal.

11. The differential amplifier of claim 10, wherein the differential amplifier means includes means for adjusting the gain of the amplification in response to a gain adjustment signal.

12. A differential amplifier for amplifying a differential input voltage to generate an amplified output voltage, comprising:

first and second transistors arranged as a pair, each of the first and second transistors having a base, a collector and an emitter, the emitters of the first and second transistors being coupled together at a common emitter node, the collectors of the first and second transistors being coupled to a first supply voltage through first and second load elements, respectively, the differential input voltage being coupled across the bases of the first and second transistors, wherein the common emitter node is coupled to a second supply voltage through a first current source, the amplified output voltage being taken across the collectors of the first and second transistors; and first and second diode elements arranged as a pair, each of the first and second diode elements having an anode and a cathode, the cathodes of the first and second diode elements being coupled together at a common cathode node, the anodes of the first and second diode elements being coupled to the collectors of the first and second transistors, respectively, the common cathode node being coupled to the second supply voltage through a second current source, wherein the first and second diode elements form a linearization circuit to increase the linearity of the differential amplifier.

13. The differential amplifier of claim 12, wherein the first current source is an adjustable current source such that the gain of the differential amplifier depends on the adjustment of the first current source.

14. The differential amplifier of claim 12, wherein the second current source is an adjustable current source such that the linearity of the differential amplifier depends on the adjustment of the second current source.

15. The differential amplifier of claim 12, wherein the first and second current sources are both adjustable current sources such that the gain and linearity of the differential amplifier both depend on the adjustments of the first and second current sources.

16. The differential amplifier of claim 12, wherein the first and second diode elements include first and second diode-connected transistors, respectively.

17. The differential amplifier of claim 16, wherein the first and second transistors are both bipolar transistors.

18. The differential amplifier of claim 17, wherein the first and second transistors and the first and second diode-connected transistors are all formed on an integrated circuit.

19. A differential amplifier for amplifying a differential input voltage to generate an amplified output voltage, comprising:

first and second transistors arranged as a pair, each of the first and second transistors having a base, a collector and an emitter, the bases of the first and second transistors being coupled to a common bias signal, the collectors of the first and second transistors being coupled to a first supply voltage through first and second load elements, respectively, the differential input voltage being coupled across the emitters of the first and second transistors, the amplified output voltage being taken across the collectors of the first and second transistors; and first and second diode elements arranged as a pair, each of the first and second diode elements having an anode and a cathode, the cathodes of the first and second diode elements being coupled together at a common cathode node, the anodes of the first and second diode elements being coupled to the collectors of the first and second transistors, respectively, the common cathode node being coupled to a second supply voltage through a current source, wherein the first and second diode elements form a linearization circuit to increase the linearity of the differential amplifier.

20. The differential amplifier of claim 19, wherein the common bias signal has a level such that the gain of the differential amplifier depends on the level of the common bias signal.

21. The differential amplifier of claim 19, wherein the current source is an adjustable current source such that the linearity of the differential amplifier depends on the adjustment of the current source.

22. The differential amplifier of claim 19, wherein the common bias signal has a level and the current source is an adjustable current source such that the gain and linearity of the differential amplifier depend on the level of the common bias signal and the adjustment of the current source.

* * * * *

UNITED STATES PATENT AND TRADEMARK OFFICE
CERTIFICATE OF CORRECTION

PATENT NO. : 5,990,740
DATED : November 23, 1999
INVENTOR(S) : John B. Groe

It is certified that error appears in the above-identified patent and that said Letters Patent is hereby corrected as shown below:

In column 2, line 34, please delete "$I_1 = I_E$" and substitute --$I_1 \approx I_E$-- therefor.

In column 7, line 39, please delete "$f|I_4-I_3| R_L \Delta I_{FB}$" and substitute -- $f \propto |I_4-I_3| \propto R_L \Delta I_{FB}$ -- therefor.

Signed and Sealed this

Twenty-fourth Day of April, 2001

Attest:

NICHOLAS P. GODICI

Attesting Officer     Acting Director of the United States Patent and Trademark Office